United States Patent
Wang et al.

(10) Patent No.: US 8,081,936 B2
(45) Date of Patent: Dec. 20, 2011

(54) METHOD FOR TUNING A DIGITAL COMPENSATION FILTER WITHIN A TRANSMITTER, AND ASSOCIATED DIGITAL COMPENSATION FILTER AND ASSOCIATED CALIBRATION CIRCUIT

(75) Inventors: Chi-Hsueh Wang, Kaohsiung (TW); Chun-Ming Kuo, Taipei County (TW); Ying-Ying Chen, Taipei (TW); Tai-Yuan Yu, Taoyuan County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 238 days.

(21) Appl. No.: 12/626,621

(22) Filed: Nov. 26, 2009

(65) Prior Publication Data

US 2010/0183091 A1 Jul. 22, 2010

Related U.S. Application Data

(60) Provisional application No. 61/146,340, filed on Jan. 22, 2009.

(51) Int. Cl.
*H04B 17/00* (2006.01)
(52) U.S. Cl. ............... 455/115.1; 455/112; 455/110; 455/260; 455/113; 332/100; 332/103; 331/16
(58) Field of Classification Search ............... 455/115.1, 455/112, 110, 260, 113; 332/100, 103; 331/16
See application file for complete search history.

(56) References Cited

U.S. PATENT DOCUMENTS

| | | | |
|---|---|---|---|
| 5,914,633 A | 6/1999 | Comino | |
| 6,008,703 A * | 12/1999 | Perrott et al. | 332/100 |
| 6,731,145 B1 | 5/2004 | Humphreys | |
| 6,806,780 B2 | 10/2004 | Fontaine | |
| 6,972,633 B2 | 12/2005 | Vilhonen | |
| 7,068,112 B2 | 6/2006 | Gotz | |
| 7,224,237 B2 * | 5/2007 | Hirano et al. | 332/103 |
| 7,382,201 B1 * | 6/2008 | Yu et al. | 331/16 |
| 2001/0054974 A1 | 12/2001 | Wright | |
| 2002/0191720 A1 | 12/2002 | Neubauer | |
| 2004/0041638 A1 * | 3/2004 | Vilcocq et al. | 331/16 |
| 2007/0291881 A1 | 12/2007 | Glass | |

FOREIGN PATENT DOCUMENTS

CN 101069345 A 11/2007

OTHER PUBLICATIONS

Pierre-Henri Bonnaud, Markus Hammes, Andre Hanke, Jens Kissing, Rudolf Koch, Eric Labarre, Christoph Schwoerer, "A Fully Integrated SoC for GSM/GPRS in 0.13 µm CMOS", ISSCC 2006, Session 26, Cellular Building Blocks and Socs, 26.7, 2006.

(Continued)

*Primary Examiner* — Sanh Phu
(74) *Attorney, Agent, or Firm* — Winston Hsu; Scott Margo (57) ABSTRACT

A method for tuning a digital compensation filter within a transmitter includes: obtaining at least one loop gain calibration result by performing loop gain calibration based upon signals of at least a portion of the transmitter, and obtaining at least one resistance-capacitance (RC) detection result by performing RC detection on the portion of the transmitter without individually measuring resistance values of resistors therein and capacitance values of capacitors therein, wherein the RC detection result corresponds to a detected value representing a product of a resistance value and a capacitance value, and the digital compensation filter includes a gain compensation module and an RC compensation module; and tuning the digital compensation filter by respectively inputting the loop gain calibration result and the RC detection result into the gain compensation module and the RC compensation module. An associated digital compensation filter and an associated calibration circuit are also provided.

20 Claims, 9 Drawing Sheets

OTHER PUBLICATIONS

Robert Bogdan Staszewski, John Wallberg, Sameh Rezeq, Chih-Ming Hung, Oren Eliezer, Sudheer Vemulapalli, Chan Fernando, Ken Maggio, Roman Staszewski, Nathen Barton, Meng-Chang Lee, Patrick Cruise, Mitch Entezari, Khurram Muhammad, Dirk Leipold, "All-Digital PLL and GSM/EDGE Transmitter in 90nm CMOS", ISSCC 2005, Session 17, RF Cellular ICs, 17.5, 2005.

* cited by examiner

|  | f(MHz) | b | a |
|---|---|---|---|
| $w_1$ | 0.153 | 0.8998 | -0.7999 |
| $w_2$ | 6.46 | 0.1759 | 0.6482 |
| $w_3$ | 48.69 | 0.0275 | 0.9449 |
| $f_s$ | 4.33 | | |

METHOD FOR TUNING A DIGITAL COMPENSATION FILTER WITHIN A TRANSMITTER, AND ASSOCIATED DIGITAL COMPENSATION FILTER AND ASSOCIATED CALIBRATION CIRCUIT

CROSS REFERENCE TO RELATED APPLICATIONS

This application claims the benefit of U.S. Provisional Application No. 61/146,340, which was filed on Jan. 22, 2009, and is entitled "PLL Loop Filter Calibration by Digital Filter"

BACKGROUND

The present invention relates to an on-line self-calibration scheme of a digital compensation filter for performing digital compensation filtering on baseband data to be utilized by a phase locked loop (PLL) within a transmitter, and more particularly, to a method for tuning a digital compensation filter within a transmitter, and to an associated digital compensation filter and an associated calibration circuit.

Digital intensive RF design is of great research interest recently, where RF circuit requirements could be relaxed because of the possibility of digitally repairing RF impairments, and designs could be migrated to different technology node or foundry much more effortlessly. One exemplary application is the direct-frequency-modulated (DFM) PLL, where the baseband signal is pre-emphasized digitally to compensate for PLL low pass response. The PLL's loop bandwidth can therefore be optimized for noise filtering while high data rate modulation is still possible. However, problems such as mismatch between PLL loop bandwidth and the conventional digital pre-emphasis filter will result in significant transmission signal quality degradation. Precise control for loop parameters such as voltage-controlled oscillator (VCO) gain and loop gain and improving robustness against process-voltage-temperature (PVT) variations are keys for mass production of the DFM PLLs. According to the related art, the so-called all-digital PLL (ADPLL) is one candidate for implementing the DFM PLLs. However, it still suffers from the limitations of wide tracking range and its complicated design procedure. Moreover, temperature to digital converter (TDC) resolution and digital controlled oscillator (DCO) gain are unfortunately both PVT sensitive parameters. Thus, a novel method is required for providing precise loop parameter control and improving robustness against PVT variations.

SUMMARY

It is therefore an objective of the claimed invention to provide a method for tuning a digital compensation filter within a transmitter, and to provide an associated digital compensation filter and an associated calibration circuit, in order to solve the above-mentioned problems.

An exemplary embodiment of a method for tuning a digital compensation filter within a transmitter comprises: obtaining at least one loop gain calibration result by performing loop gain calibration based upon signals of at least a portion of the transmitter, and obtaining at least one resistance-capacitance (RC) detection result by performing RC detection on the portion of the transmitter without individually measuring resistance values of resistors therein and capacitance values of capacitors therein, wherein the RC detection result corresponds to a detected value representing a product of a resistance value and a capacitance value, and the digital compensation filter comprises a gain compensation module and an RC compensation module; and tuning the digital compensation filter by respectively inputting the loop gain calibration result and the RC detection result into the gain compensation module and the RC compensation module. In particular, the portion of the transmitter comprises a phase locked loop (PLL).

An exemplary embodiment of an associated digital compensation filter that is positioned within a transmitter comprises a gain compensation module and an RC compensation module. The gain compensation module is arranged to receive at least one loop gain calibration result, wherein the loop gain calibration result is obtained by performing loop gain calibration based upon signals of at least a portion of the transmitter. In addition, the RC compensation module is arranged to receive at least one RC detection result, wherein the RC detection result is obtained by performing RC detection on the portion of the transmitter without individually measuring resistance values of resistors therein and capacitance values of capacitors therein, and the RC detection result corresponds to a detected value representing a product of a resistance value and a capacitance value. Additionally, the digital compensation filter is tuned by respectively inputting the loop gain calibration result and the RC detection result into the gain compensation module and the RC compensation module. In particular, the portion of the transmitter comprises a PLL.

An exemplary embodiment of an associated calibration circuit that is positioned within a transmitter comprises a digital compensation filter and a control module, where the digital compensation filter comprises a gain compensation module and an RC compensation module. The digital compensation filter is arranged to perform digital compensation filtering on baseband data to be utilized by at least a portion of the transmitter. In addition, the control module is arranged to perform self-calibration control. More particularly, the control module obtains at least one loop gain calibration result by performing loop gain calibration based upon signals of the portion of the transmitter, and further obtains at least one RC detection result by performing RC detection on the portion of the transmitter without individually measuring resistance values of resistors therein and capacitance values of capacitors therein, wherein the RC detection result corresponds to a detected value representing a product of a resistance value and a capacitance value. Additionally, the control module tunes the digital compensation filter by respectively inputting the loop gain calibration result and the RC detection result into the gain compensation module and the RC compensation module. In particular, the portion of the transmitter comprises a PLL.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
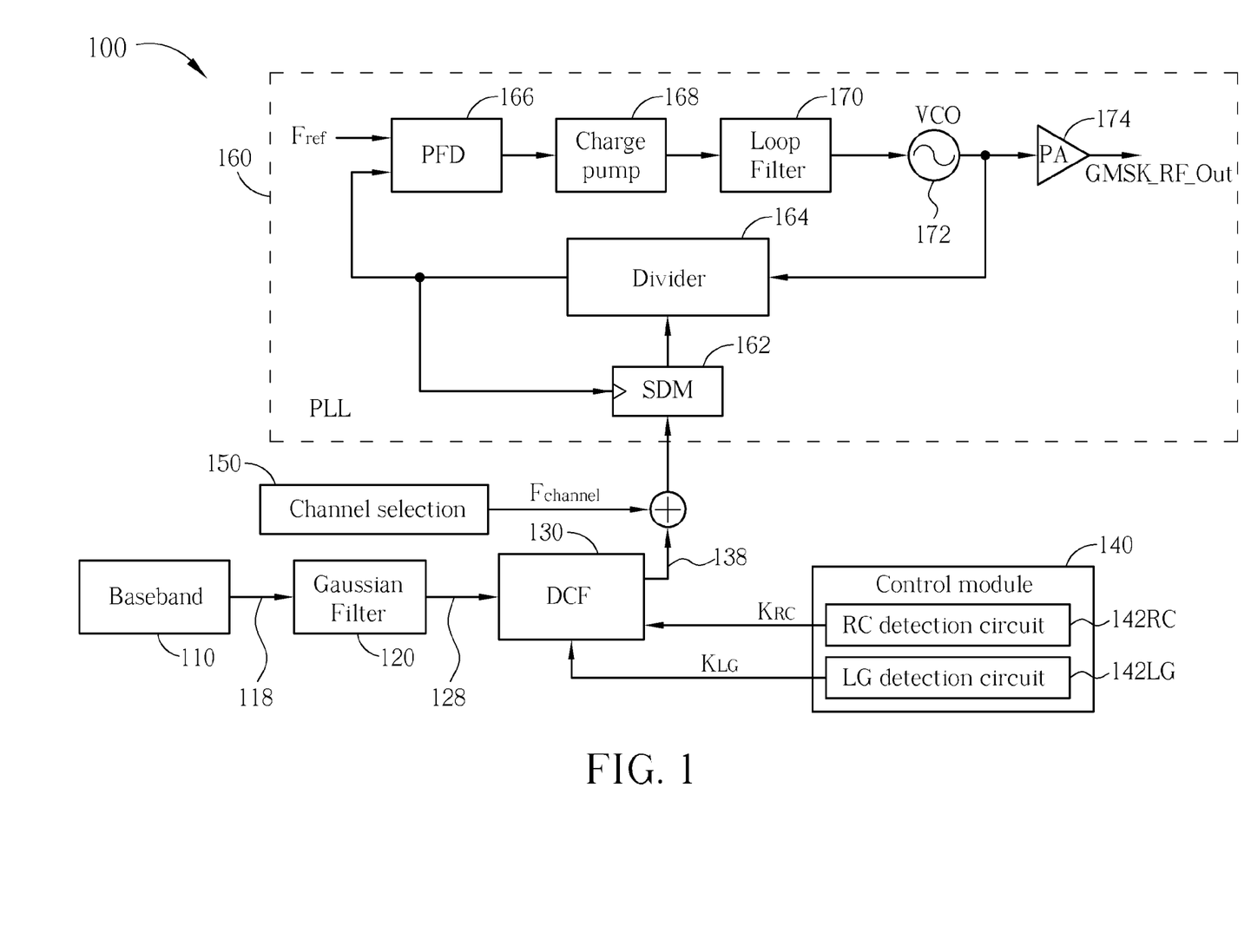
FIG. 1 is a diagram of a calibration circuit according to a first embodiment of the present invention.

Please refer to FIG. 1, which illustrates a diagram of a calibration circuit 100 according to a first embodiment of the present invention, where the calibration circuit 100 of this embodiment is a self-calibration circuit. As shown in FIG. 1, the calibration circuit 100 comprises a baseband circuit 110 (labeled "Baseband"), a Gaussian filter 120, a digital compensation filter (DCF) 130, a control module 140, a channel selection unit 150 (labeled "Channel selection"), and a phase locked loop (PLL) 160, where the control module 140 comprises a loop gain (LG) detection circuit 142LG and a resistance-capacitance (RC) detection circuit 142RC, and the PLL 160 comprises a digital sigma-delta-modulator 162 (labeled "SDM"), a divider 164, a phase frequency detector (PFD) 166, a charge pump 168, a loop filter 170, a voltage-controlled oscillator (VCO) 172, and a power amplifier (PA) 174. In particular, the calibration circuit 100 is positioned within a transmitter such as a quad-band GSM/GPRS transmitter, which can be implemented based on a fractional-N PLL, and outputs the signal to be transmitted through a GMSK radio frequency (RF) output (labeled "GMSK_RF_Out"). This is for illustrative purposes only, and is not meant to be a limitation of the present invention. According to a variation of this embodiment, the Gaussian filter 120 is not required, and therefore, can be omitted. According to another variation of this embodiment, the GMSK RF output can be replaced by another output that is not related to GMSK.

According to this embodiment, the baseband circuit 110 outputs baseband data 118 to the Gaussian filter 120, and the Gaussian filter 120 filters the baseband data 118 to generate filtered baseband data 128 and outputs the filtered baseband data 128 to the DCF 130. Under control of the control module 140, the DCF 130 is arranged to perform digital compensation filtering on the baseband data to be utilized by at least a portion of the transmitter. For example, the portion of the transmitter comprises the PLL 160. In another example, the portion of the transmitter is the PLL 160.

More specifically, the DCF 130 performs digital compensation filtering on the filtered baseband data 128 to generate the filtered baseband data 138, where an adder is inserted between the DCF 130 and the PLL 160 for injecting the sum of the channel frequency $F_{channel}$ assigned by the channel selection unit 150 and the filtered baseband data 138 into the PLL 160. In addition, the digital sigma-delta-modulator 162 performs sigma-delta-modulation on the aforementioned sum according to the output signal of the divider 164, in order to generate a modulated result for the divider 164. As a result, the PLL 160 operates based upon the modulated result mentioned above and a reference frequency $F_{ref}$. For example, the PFD 166 performs phase/frequency detection on the output signal of the divider 164 based upon the reference frequency $F_{ref}$ to generate a detection signal, in order to make the charge pump 168 output accordingly. The loop filter 170 performs loop filtering on the output of the charge pump 168 to generate a voltage signal, in order to control the VCO 172. The output of the VCO 172 is amplified by the PA 174, and further utilized as a feedback that is sent toward the PFD 166 through the divider 164.

In practice, the calibration circuit 100 can be divided into an analog part and a digital part, where the analog part comprises the divider 164 (e.g. a divide-by-two or divide-by-four output divider), the PFD 166, the charge pump 168, the loop filter 170 (e.g. an on-chip third-order loop filter), the VCO 172, the PA 174, and a portion of the RC detection circuit 142RC within the control module 140, while the digital part comprises the baseband circuit 110, the Gaussian filter 120 (e.g. a Gaussian pulse shaping filter), the DCF 130, a portion of the control module 140, the channel selection unit 150, and the digital sigma-delta-modulator 162.

Figure 2:
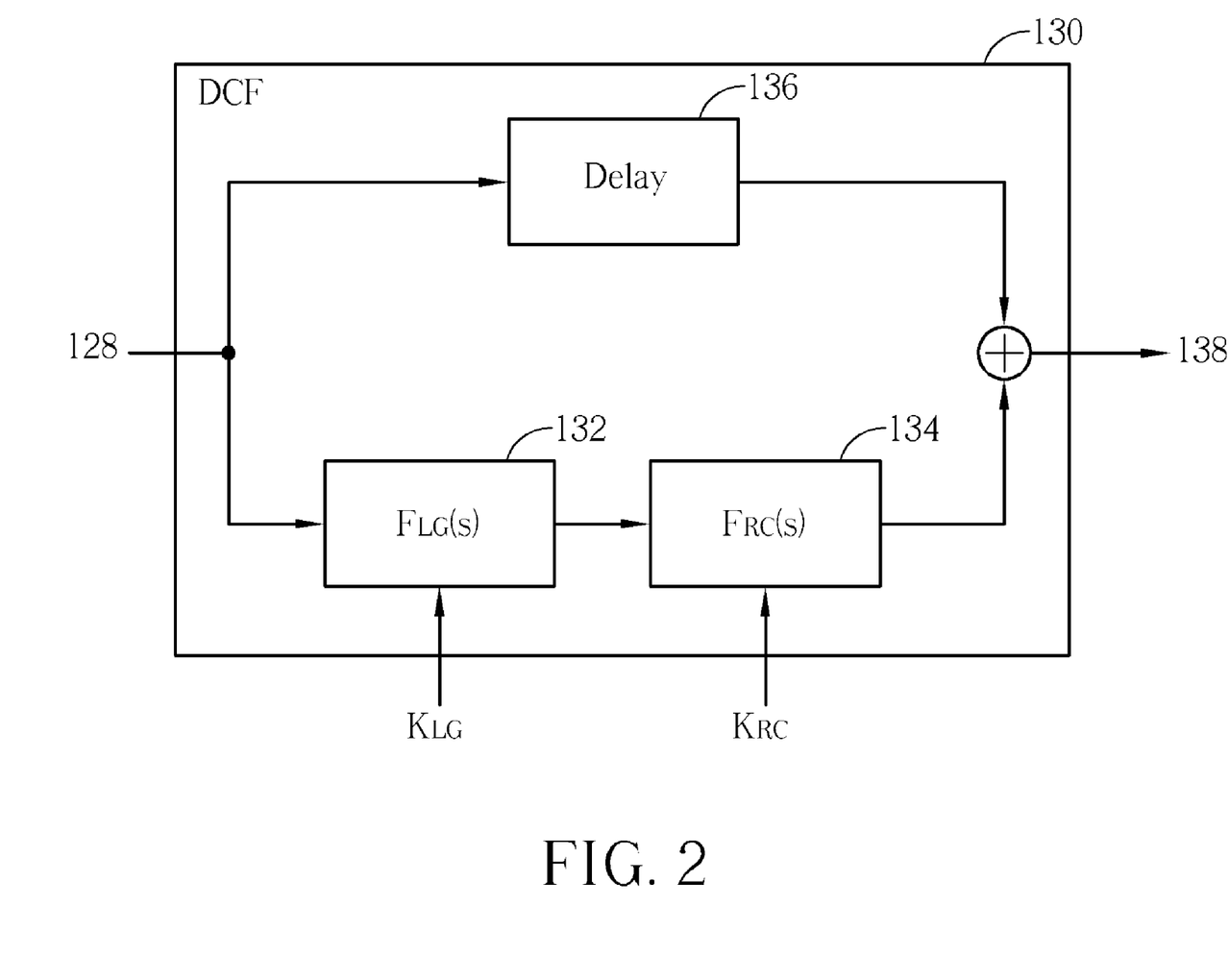
FIG. 2 illustrates a block diagram of the digital compensation filter (DCF) shown in FIG. 1.

FIG. 2 illustrates a block diagram of the DCF 130 shown in FIG. 1, where the DCF 130 comprises a gain compensation module 132 (labeled "$F_{LG}(s)$" in FIG. 2) and an RC compensation module 134 (labeled "$F_{RC}(s)$" in FIG. 2) on the lower path within the DCF 130, and further comprises a delay 136 on the upper path within the DCF 130. Here, the lower path and the upper path within the DCF 130 receive the same input of the DCF 130, such as the filtered baseband data 128. According to this embodiment, the gain compensation module 132 is arranged to receive at least one loop gain calibration result, such as the loop gain calibration result $K_{LG}$ or a representative thereof, where the loop gain calibration result is obtained by performing loop gain calibration based upon some signals of at least a portion of the transmitter. For example, the portion of the transmitter comprises the PLL 160. In another example, the portion of the transmitter is the PLL 160. In addition, the RC compensation module 134 is arranged to receive at least one RC detection result, such as the RC detection result $K_{RC}$ or a representative thereof, where the RC detection result $K_{RC}$ (or the representative thereof) is obtained by performing RC detection on the portion of the transmitter without individually measuring resistance values of resistors therein and capacitance values of capacitors therein, and the RC detection result $K_{RC}$ (or the representative thereof) corresponds to a detected value representing a product of a resistance value and a capacitance value. Additionally, the delay 136 delays the input of the DCF 130, and more particularly, the filtered baseband data 128, in order to generate the delayed version thereof as the output of the upper path shown in FIG. 2. Here, an adder is arranged to sum up the outputs of the upper and the lower paths shown in FIG. 2 to generate an output of the DCF 130, such as the filtered baseband data 138. As a result, the filtered baseband data 138 is substantially the sum of the compensation result from the components of the lower path (i.e. the gain compensation module 132 and the RC compensation module 134) and the delayed version of the filtered baseband data 128. Please note that, based upon the architecture shown in FIG. 2, the DCF 130 is tuned by respectively inputting the loop gain calibration result $K_{LG}$ (or the representative thereof) and the RC detection result $K_{RC}$ (or the representative thereof) into the gain compensation module 132 and the RC compensation module 134. More particularly, by utilizing the LG detection circuit 142LG that controls the DCF 130 through the loop gain calibration result $K_{LG}$, the control module 140 is capable of on-line calibrating the loop gain compensation characteristics of the DCF 130. Similarly, by utilizing the RC detection circuit 142RC that controls the DCF 130 through the RC detection result $K_{RC}$, the control module 140 is capable of on-line calibrating the RC compensation characteristics of the DCF 130.

Please note that the control module 140 of this embodiment is arranged to perform self-calibration control, where the LG detection circuit 142LG performs the loop gain calibration mentioned above, and the RC detection circuit 142RC performs the RC detection mentioned above. For example, the LG detection circuit 142LG may comprise a bang-bang phase detector (BBPD) (not shown) and an adaptive gain accumulator (not shown), where the BBPD generates a digital output indicating either a phase lead or lag of the output signal of the divider 164 with respect to the reference frequency $F_{ref}$, and the adaptive gain accumulator accumulates the digital output with an up-down counter therein. More particularly, in a situation where the divider 164 is a fractional divider, the result of the up-down counter can be added with the channel code to be input into the divider 164, so the divider ratio can be adjusted according to the direction of the phase lead/lag. After the adjustment of the divider ratio, the frequency offset at the output of the VCO 172 will regenerate to reduce the static phase error. When the static phase error is close to zero, the BBPD mentioned above will indicate equal opportunity of phase lead or lag, and therefore, the fractional code converges. Thus, by utilizing the LG detection circuit 142LG, the control module 140 is capable of on-line calibrating the loop gain compensation characteristics of the DCF 130 through the loop gain calibration result $K_{LG}$. Please refer to FIG. 3 for further implementation details.

Figure 3:
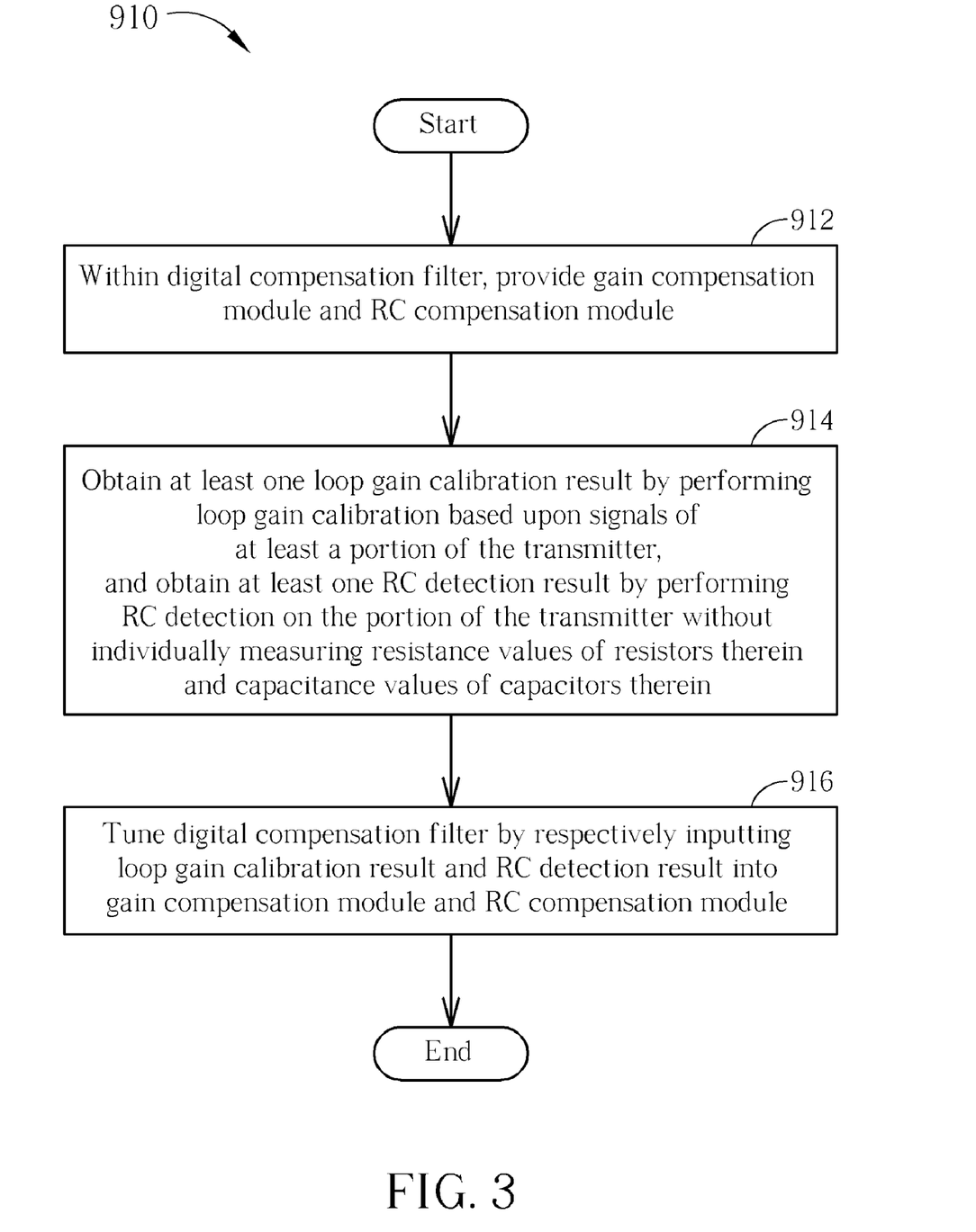
FIG. 3 is a flowchart of a method for tuning a digital compensation filter within a transmitter according to an embodiment of the present invention.

FIG. 3 is a flowchart of a method 910 for tuning a digital compensation filter within a transmitter according to an embodiment of the present invention. The method shown in FIG. 3 can be applied to the calibration circuit 100 shown in FIG. 1, and more particularly, the DCF 130 therein. In addition, the method shown in FIG. 3 can be implemented by utilizing the calibration circuit 100 shown in FIG. 1, and more particularly, the DCF 130 therein. The method is described as follows.

In Step 912, within the digital compensation filter such as the DCF 130 shown in FIG. 2, provide a gain compensation module and a RC compensation module, such as the gain compensation module 132 and the RC compensation module 134.

In Step 914, the control module 140 obtains at least one loop gain calibration result by performing loop gain calibration based upon signals of at least a portion of the transmitter (e.g. the portion of the transmitter comprises the PLL 160, or the portion of the transmitter is the PLL 160), and obtains at least one RC detection result by performing RC detection on the portion of the transmitter without individually measuring resistance values of resistors therein and capacitance values of capacitors therein. For example, the aforementioned at least one loop gain calibration result can be the loop gain calibration result $K_{LG}$ or the representative thereof. In another example, the aforementioned at least one RC detection result can be the RC detection result $K_{RC}$ or the representative thereof. For better comprehension, the loop gain calibration result $K_{LG}$ and the RC detection result $K_{RC}$ are utilized in some descriptions. This is for illustrative purposes only, and is not meant to be a limitation of the present invention. According to variations of this embodiment, the loop gain calibration result $K_{LG}$ can be replaced by the representative thereof, and/or the RC detection result $K_{RC}$ can be replaced by the representative thereof. In this embodiment, the loop gain calibration can be performed based upon the output signal of the divider 164 and the reference frequency $F_{ref}$.

In Step 916, the control module 140 tunes the digital compensation filter, such as the DCF 130 shown in FIG. 2, by respectively inputting the loop gain calibration result $K_{LG}$ and the RC detection result $K_{RC}$ into the gain compensation module 132 and the RC compensation module 134.

In this embodiment, the control module 140 is arranged to tune the DCF 130 in order to perform digital compensation on the portion of the transmitter in an on-line self-calibration manner. More particularly, the control module 140 obtains a plurality of RC detection results (e.g. one or more representatives/detected values of the RC detection result $K_{RC}$) by performing the RC detection on the portion of the transmitter without individually measuring resistance values of resistors therein and capacitance values of capacitors therein, and the digital compensation filter is tuned based upon variations of the RC detection results. Thus, the control module 140 is arranged to dynamically tune the DCF 130 by respectively inputting the RC detection results into the RC compensation module 134, in order to calibrate the compensation characteristics of the DCF 130 based upon the variations of the RC detection results (e.g. one or more representatives/detected values of the RC detection result $K_{RC}$).

In particular, Step 914 and Step 916 can be repeatedly executed. According to a special case of this embodiment, after Step 916 is executed, Step 914 can be re-entered. As a result, the DCF 130 is dynamically tuned by respectively inputting the RC detection results into the RC compensation module 134 such that the DCF 130 is tuned based upon the variations of the RC detection results.

As mentioned, the RC detection result $K_{RC}$ corresponds to a detected value representing a product of a resistance value and a capacitance value. By utilizing the RC detection result $K_{RC}$, it is unnecessary to measure the resistance values of the resistors in the PLL 160 (and more particularly, the loop filter 170) and measure the capacitance values of the capacitors in the PLL 160 (and more particularly, the loop filter 170). As a result, the method of the embodiment can provide high performance and high accuracy in contrast to the related art.

Figure 4A:
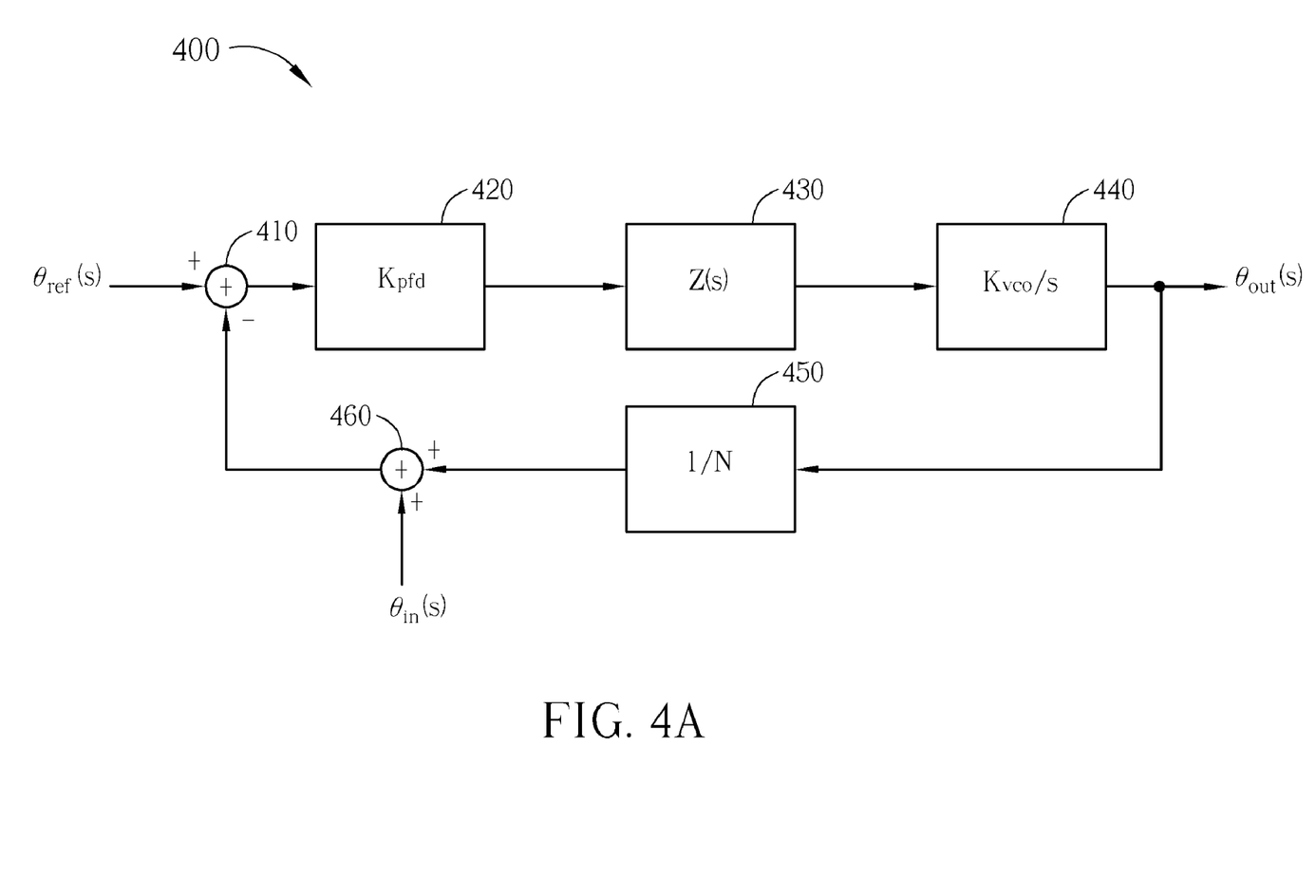
FIG. 4A illustrates a block diagram corresponding to the phase locked loop (PLL) shown in FIG. 1 according to a special case of the embodiment shown in FIG. 3.

FIG. 4A illustrates a block diagram corresponding to the PLL 160 shown in FIG. 1 according to a special case of the embodiment shown in FIG. 3. The architecture 400 shown in FIG. 4A comprises functional blocks 410 and 420 corresponding to the PFD 166 and the charge pump 168, and comprises functional blocks 430 and 440 respectively corresponding to the loop filter 170 and the VCO 172, and further comprises functional blocks 450 and 460 corresponding to the digital sigma-delta-modulator 162 and the divider 164. For better comprehension, the architecture 400 can be seen as a phase domain model of the PLL 160, where the notations $K_{pfd}$, $Z(s)$, and $K_{VCO}$ respectively represent the transfer functions of the PFD 166, the loop filter 170, and the VCO 172, while the notations $\theta_{ref}$, $\theta_{out}$, and $\theta_{in}$ are phase domain representatives of associated signals such as the reference frequency $F_{ref}$, the output of the VCO 172, and the aforementioned sum injected into the PLL 160, respectively. Regarding the notation "s", such as those shown in FIG. 2 or FIG. 4A, please be noted that s=jw, where the notation j represents the imaginary unit, and the notation w represents the angular frequency. Typically, the imaginary unit can be loosely referred to as the "square root of −1", although both j and −j can be regarded as square roots of −1.

Figure 4B:
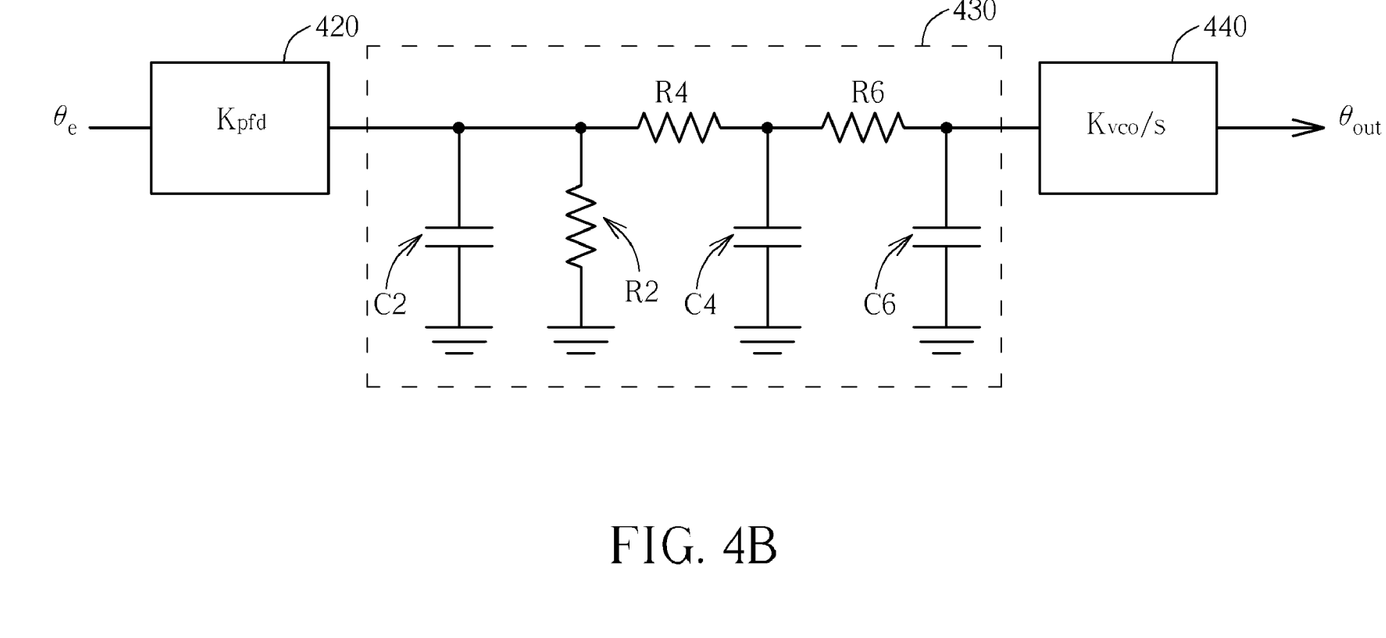
FIG. 4B illustrates implementation details of resistor-capacitor circuits utilized in the special case shown in FIG. 4A.

FIG. 4B illustrates implementation details of some resistor-capacitor circuits utilized in the special case shown in FIG. 4A, where the functional block 430 corresponding to the loop filter 170 comprises the resistor-capacitor circuits comprising the resistors R2, R4, and R6 and the capacitors C2, C4, and C6. For simplicity, the resistance values of the resistors {R2, R4, R6} of the loop filter 170 and the capacitance values of the capacitors {C2, C4, C6} of the loop filter 170 are respectively written with similar notations $\{R_2, R_4, R_6\}$ and $\{C_2, C_4, C_6\}$ hereafter. In addition, the notation $\theta_e$ is a phase domain representative of the phase error between the reference frequency $F_{ref}$ and the output signal of the divider 164.

Based upon the illustrations shown in FIGS. 4A-4B, the associated operation principles are explained as follows.

Let the notations $H_{comp}(s)$ and $H_{PLL}(s)$ respectively represent the transfer functions of the DCF 130 and the PLL 160. Given that the notation $H_{EQ}(s)$ represents an equal transfer function for a predetermined range of frequency, e.g. the equal transfer function $H_{EQ}(s)$ is a target overall response to be achieved by controlling the compensation characteristics of the DCF 130 during the on-line self-calibration of the calibration circuit 100, the relationships between these transfer functions can be expressed with the following equations:

$$H_{comp}(s)*H_{PLL}(s)=H_{EQ}(s); \text{ or}$$

$$H_{comp}(s)=H_{EQ}(s)/H_{PLL}(s).$$

In order to design the DCF 130, given that the PLL 160 is a fractional-N PLL in this embodiment, the latter of the above two equations can be written as follows:

$$H_{comp}(s)=H_{EQ}(s)*(N/H_{PLL}(s))$$

$$=H_{EQ}(s)*((1+T_{OP}(s))/T_{OP}(s))$$

$$=H_{EQ}(s)*(1+(1/T_{OP}(s)));$$

where the notation $T_{OP}(s)$ represents the transfer function of the PLL 160 with a open loop configuration.

The above equation corresponds to an idealized situation, while an associated equation corresponding to a real situation can be written as follows:

$$H'_{comp}(s)=H_{EQ}(s)*(1+(1/T'_{OP}(s)))$$

$$=H_{EQ}(s)*(1+(1/(T_{OP}(s)/K_{Cal})))$$

$$=H_{EQ}(s)*(1+(1/T_{OP}(s))*K_{Cal});$$

where the notation $H'_{comp}(s)$ represents the transfer function of the DCF 130 in the real situation, the notation $T'_{OP}(s)$ represents the transfer function of the PLL 160 with the open loop configuration in the real situation, and the notation $K_{Cal}$ represents the calibration factor that should be utilized for eliminating the difference between the real situation and the idealized situation.

⇒

$$K_{Cal}=K_G/K'_G=(K_{pfd}*K_{VCO}*N')/(K'_{pfd}*K'_{VCO}*N); \text{ and}$$

$$T_{OP}(s)=(2\pi)*(K_{pfd}*K_{VCO}*Z(s))/(N*s);$$

where the notation $K_G$ represents the gain in the idealized situation, the notation $K'_G$ represents the gain in the real situation, the notations $K'_{pfd}$ and $K'_{VCO}$ respectively represent the transfer functions of the PFD 166 and the VCO 172 in the real situation, and the notation N' represents the associated expression in the real situation with respect to the value N.

Referring to FIG. 4A, $$H_{PLL}(s)=\theta_{out}/\theta_{ref}=N*T_{OP}(s)/(1+T_{OP}(s));$$

where $T_{OP}(s)=(2\pi)*(K_{pfd}*K_{VCO}*Z(s))/(N*s)$.

Referring to FIG. 4B, $$Z(s)=R_2/(1+(C_2R_2+C_4R_2+C_6R_2+C_4R_4+C_6R_4+C_6R_6)s$$

$$+(C_2C_4R_2R_4+C_2C_6R_2R_4+C_2C_6R_2R_6+C_4C_6R_2R_6+C_4C_6R_4R_6)s^2$$

$$+(C_2C_4C_6R_2R_4R_6)s^3).$$

Therefore, the transfer function $H_{comp}(s)$ of the DCF 130 can be written as follows:

$$H_{comp}(s)=H_{EQ}(s)*(1+(1/T_{OP}(s)))$$

$$=H_{EQ}(s)*(1+(Ns/(I_{pfd}*K_{VCO}*R_2))$$

$$*(1+(C_2R_2+C_4R_2+C_6R_2+C_4R_4+C_6R_4+C_6R_6)s$$

$$+(C_2C_4R_2R_4+C_2C_6R_2R_4+C_2C_6R_2R_6+C_4C_6R_2R_6+C_4C_6R_4R_6)s^2$$

$$+(C_2C_4C_6R_2R_4R_6)s^3));$$

where the notation $I_{pfd}$ represents the associated expression of current with respect to the transfer function $K_{pfd}$.

Assume that the ratio of a first R-C product to a second R-C product is a constant that is independent of the process environment of the transmitter, where the first R-C product and the second R-C product are any two of the R-C products within the above equation (e.g. $C_2R_2$, $C_4R_2$, ..., etc., and $C_2C_4R_2R_4$, $C_2C_6R_2R_4$, ..., etc., and $C_2C_4C_6R_2R_4R_6$). Therefore, by extracting common factors such as $K_{LG}$ and $K_{RC}$, the above equation can be converted into its simplified expression as follows:

$$H_{comp}(s)=H_{EQ}(s)*[1+g_1K_{LG}s+g_2K_{LG}K_{RC}s^2+g_3K_{LG}K_{RC}^2s^3+g_4K_{LG}K_{RC}^3s^4]$$

$$=H_{EQ}(s)*[1+g_1K_{LG}s*(1+K_{RC}(s/w_1))*(1+K_{RC}(s/w_2))*(1+K_{RC}(s/w_3))];$$

where the notations $g_1$, $g_2$, $g_3$, and $g_4$ represent the associated coefficients of respective terms when the common factors such as $K_{LG}$ and $K_{RC}$ are extracted, while the notations $w_1$, $w_2$, and $w_3$ represent frequency parameters of pole positions in the expression of the last line of the above equation.

Figure 5:
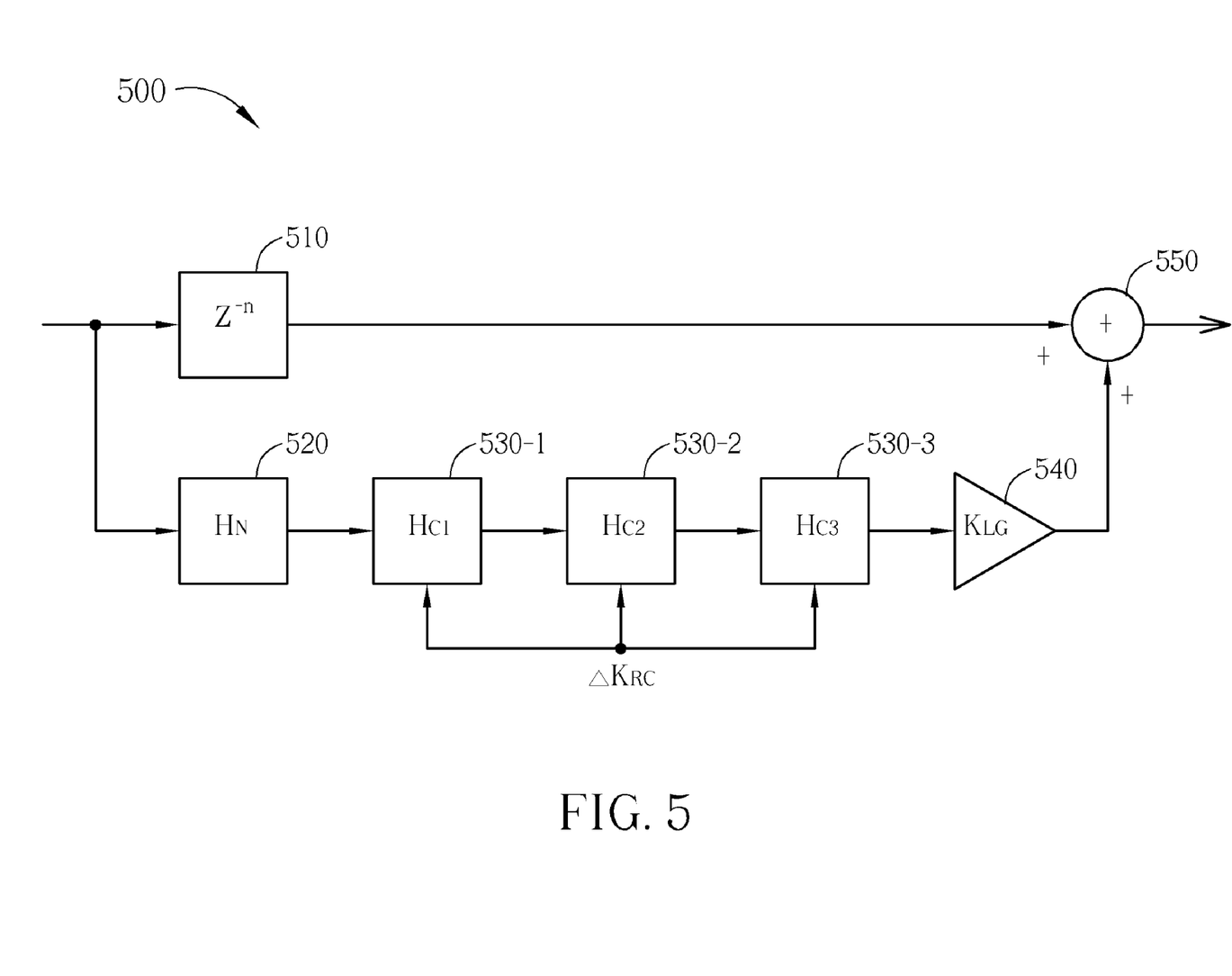
FIG. 5 illustrates the equivalent compensation structure of the digital compensation filter according to the special case shown in FIG. 4A.

⇒

$$H_{comp}(s)=H_{EQ}(s)+K_{LG}*H_N(s)*H_{C1}(s)*H_{C2}(s)*H_{C3}(s);$$

where $H_{C,i}(s)=+K_{RC}*(s/w_i))$ with the index i varying from 1 to 3 in this special case, and $H_N(s)$ represents a transfer function of a portion of the digital compensation filter, such as the functional block 520 shown in FIG. 5. Please note that the notations such as "$H_{C1}(s)$", "$H_{C2}(s)$", and "$H_{C3}(s)$" are the simplified notations of "$H_{C,1}(s)$", "$H_{C,2}(s)$", and "$H_{C,3}(s)$". It is suggested that the notation "$H_{C,i}(s)$" is not written as its simplified notation "$H_{Ci}(s)$" in order to prevent confusion when the above equation is converted into a general form.

Therefore, the DCF 130 can be designed based upon the equivalent compensation structure 500 shown in FIG. 5, where the functional blocks 510 and 550 respectively correspond to the delay 136 and the adder shown in FIG. 2, the functional blocks 530-1, 530-2, and 530-3 correspond to the RC compensation module 134, and the functional block 540 corresponds to the gain compensation module 132. Here, the functional block 510 is labeled as "$Z^{-n}$" (which means the functional block 510 is a delay), where n is an integer and can be greater than or equal to 1. Please note that the loop gain calibration result $K_{LG}$ is input into the functional block 540 shown in FIG. 5 as the gain of the amplifier represented by the functional block 540. In addition, the representative $\Delta K_{RC}$ of the RC detection result mentioned above is input into the RC compensation module 134 comprising a plurality of filtering units cascaded in series, such as the functional blocks 530-1, 530-2, and 530-3. As shown in FIG. 5, the functional blocks 530-1, 530-2, and 530-3 that are labeled "$H_{C1}$", "$H_{C2}$", and "$H_{C3}$" represent the filtering units respectively having the transfer functions $H_{C1}(s)$, $H_{C2}(s)$, and $H_{C3}(s)$. For implementation of the DCF 130, and more particularly, the equivalent compensation structure 500 shown in FIG. 5, some equations are further listed as follows:

$$H_N(s) = H_{EQ}(s)sg_1*(1+(s/w_1))*(1+(s/w_2))*(1+(s/w_3));$$

and $$H_{C,i}(s) = (1+K_{RC}*(s/w_i))/(1+(s/w_i))$$

$$= 1+\Delta K_{RC}*(s/w_i))(1+(s/w_i));$$

where $\Delta K_{RC} = K_{RC} - 1$.

In general, the number of filtering units within the plurality of filtering units cascaded in series can be greater than 3. For example, given that the notation I represents the number of filtering units within the plurality of filtering units with I being a positive integer, each filtering unit of the plurality of filtering units has the transfer function of:

$$H_{C,i}(s) = (1+K_{RC}*(s/w_i));$$

where i represents the index associated to one of the filtering units (and more particularly, the aforementioned "each filtering unit") with the index i varying from 1 to I, s=jw with j and w respectively representing the imaginary unit and the angular frequency, and $w_i$ represents the frequency parameter associated to one of the filtering units (and more particularly, the aforementioned "each filtering unit") with the index i varying from 1 to I.

In addition, the digital compensation filter such as the DCF 130 shown in FIG. 2 has a transfer function of:

$$H_{Comp}(s) = H_{EQ}(s) + K_{LG}*H_N(s)*H_{C,1}(s)*H_{C,2}(s)* \ldots * H_{C,i}(s);$$

where $H_{C,i}(s) = (1+K_{RC}*(s/w_i))$ with the index i varying from 1 to I in this general case. The definitions of the other notations such as "$H_{EQ}(s)$", "$K_{LG}$", and "$H_N(s)$" are the same as those in the special case mentioned above, respectively. Similar descriptions for this general case are not repeated in detail here.

Figure 6:
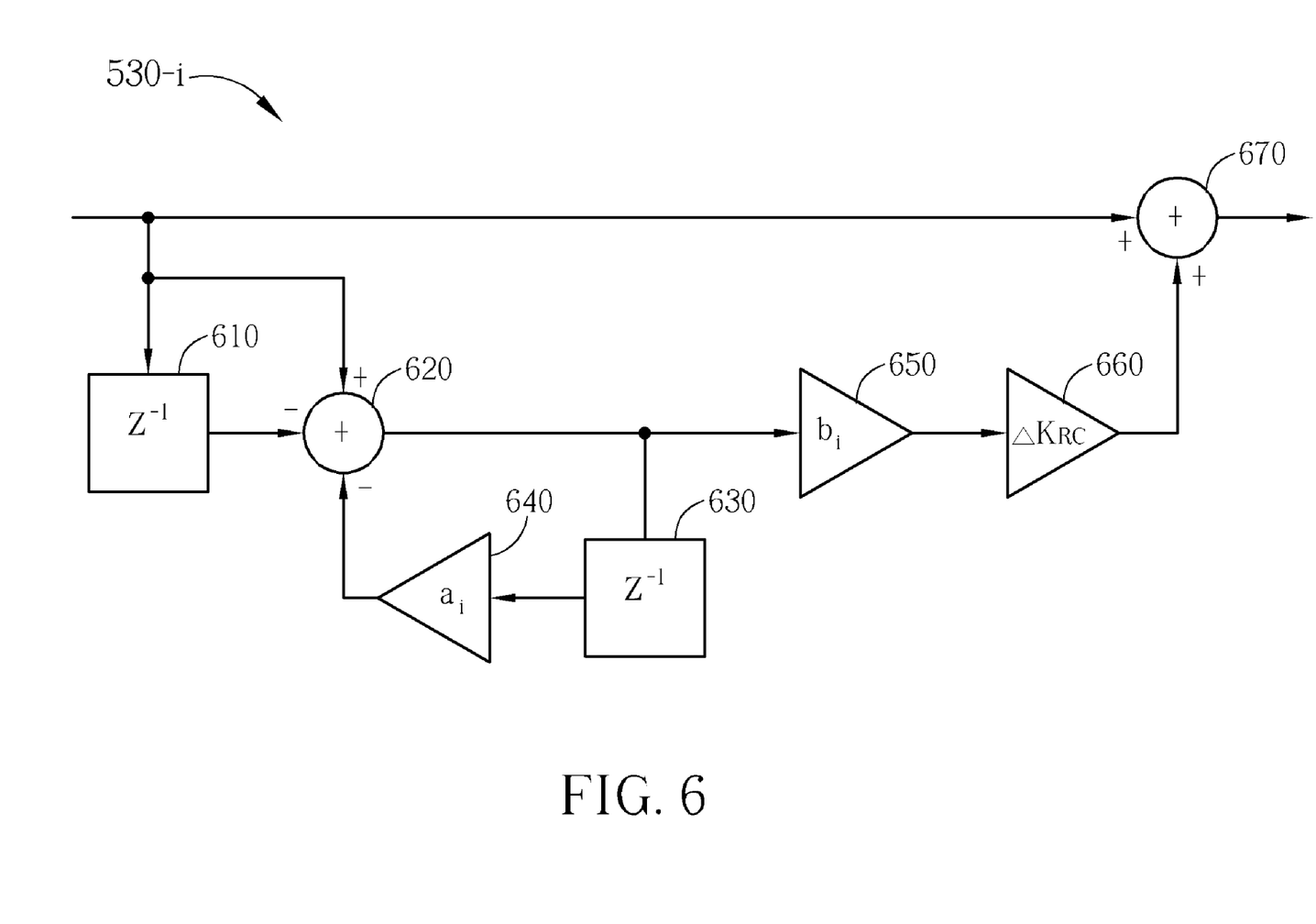
FIG. 6 illustrates implementation details of some filtering units shown in FIG. 5, and more particularly, those receiving a representative of a resistance-capacitance (RC) detection result.

FIG. 6 illustrates implementation details of some filtering units shown in FIG. 5, and more particularly, those receiving the representative $\Delta K_{RC}$ of the RC detection result mentioned above. The structure of the filtering unit 530-i can be applied to not only the aforementioned special case but also the general case mentioned above, where i varies from 1 to I in the general case. As shown in FIG. 6, the filtering unit 530-i comprises functional blocks 610, 620, 630, 640, 650, 660, and 670. The functional blocks 610 and 630 represent delay circuits, the functional blocks 620 and 670 represent adders, and the functional blocks 640, 650, and 660 represent amplifiers having the parameters $a_i$ and $b_i$ and the representative $\Delta K_{RC}$ of the RC detection result mentioned above as their gain values, respectively. Regarding the definitions of the parameters $a_i$ and $b_i$, they can be derived from bilinear transform. Here, the equation of the bilinear transform is included below for better comprehension:

$$s = 2f_s*((1-z^{-1})/(1+z^{-1}));$$

where the equation of the bilinear transform is well known, and therefore, the meaning thereof is not explained for simplicity.

After the bilinear transform from the s domain to the z domain, the equations of $H_{C,i}(s)$ can be converted into the equations of $H_{C,i}(z)$. For example, $$H_{C,i}(z) = 1+\Delta K_{RC}*((2f_s/w_i)*(1-z^{-1})/(1+z^{-1}))/(1+(2f_s/w_i)*(1-z^{-1})/(1+z^{-1}))$$

$$= 1+\Delta K_{RC}*((2f_s/(w_i+2f_s))*(1-z^{-1}))/(1+((w_i-2f_s)/(w_i+2f_s))*z^{-1})$$

$$= 1+\Delta K_{RC}*(b_i*(1-z^{-1}))/(1+*z^{-1});$$

where $a_i = (w_i-2f_s)/(w_i+2f_s)$, and $b_i = 2f_s/(w_i+2f_s)$.

Figure 7:
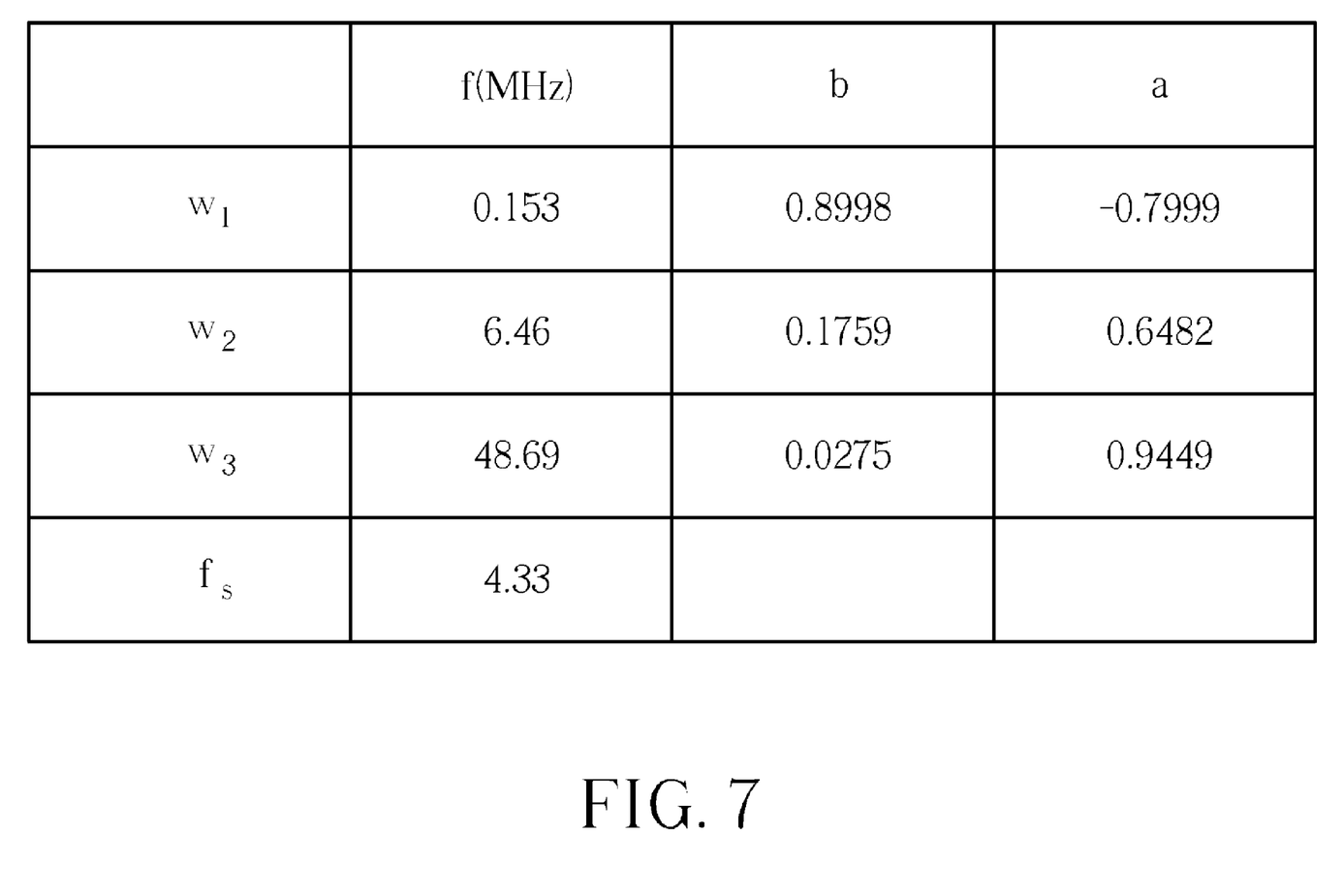
FIG. 7 is a table illustrating related parameters of the digital compensation filter according to the special case shown in FIG. 4A.

FIG. 7 is a table illustrating related parameters of the digital compensation filter such as the DCF 130 according to the special case shown in FIG. 4A. For example, given that $f_s$=4.33 MHz and i varies from 1 to 3, when $w_1$=0.153 MHz, $w_2$=6.46 MHz, and $w_1$=48.69 MHz, the approximate values of the parameters $\{a_1, a_2, a_3\}$ and $\{b_1, b_2, b_3\}$ are $\{-0.7999, 0.6482, 0.9449\}$ and $\{0.8998, 0.1759, 0.0275\}$, respectively.

Figure 8:
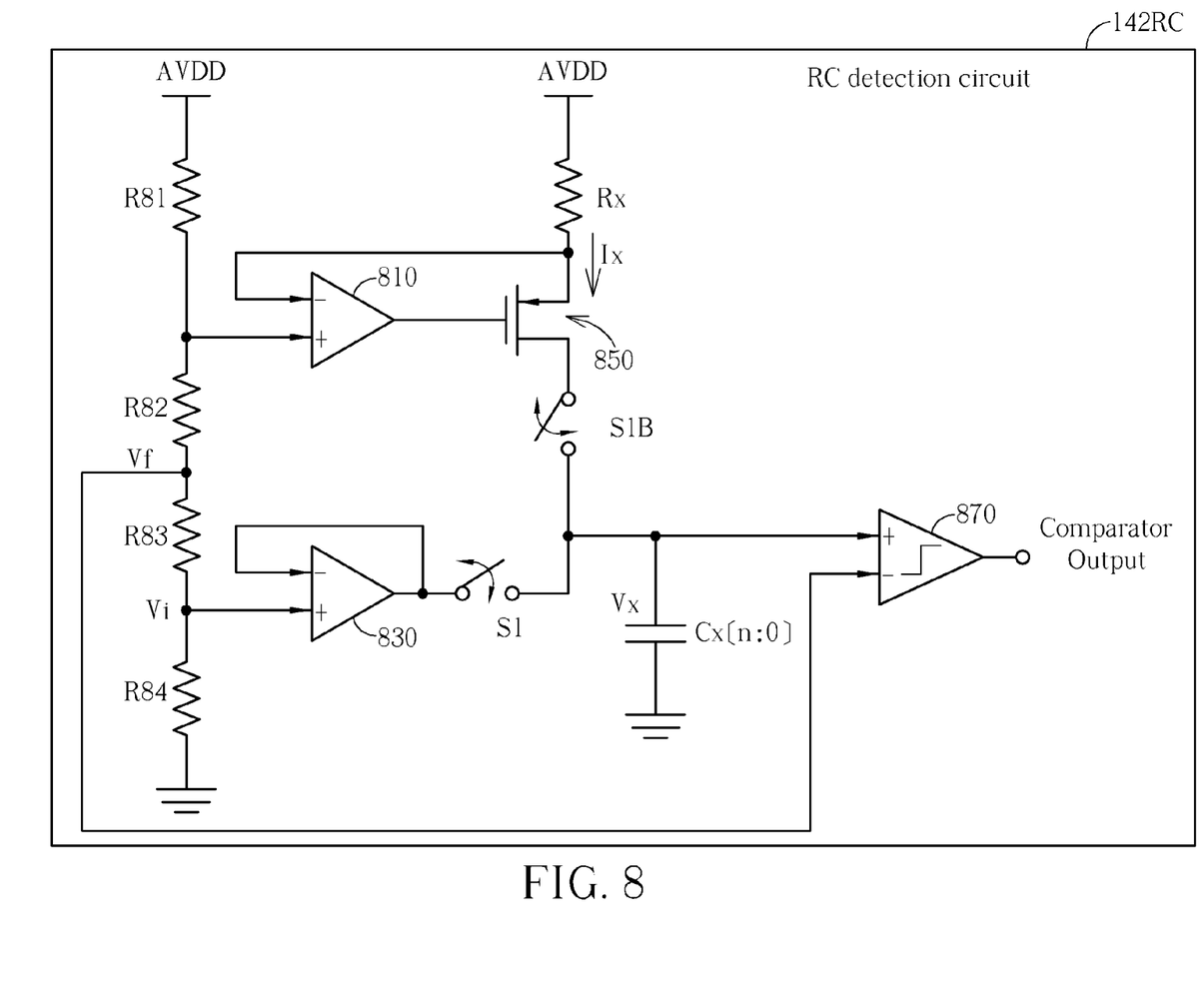
FIG. 8 illustrates implementation details of the RC detection circuit shown in FIG. 1 according to an embodiment of the present invention.

FIG. 8 illustrates implementation details of the RC detection circuit 142RC shown in FIG. 1 according to an embodiment of the present invention. The RC detection circuit 142RC of this embodiment comprises operational amplifiers (OP Amp) 810 and 830, a transistor such as a Metal-Oxide-Semiconductor Field Effect Transistor (MOSFET) 850, a comparator 870, resistors R81, R82, R83, and R84, and switches S1 and S1B, where the switch S1B is typically at an inverted status of the switch S1. Please note that the capacitor Cx may represent any of the capacitors within the resistor-capacitor circuits of the loop filter 170, and the resistor Rx may represent any of the resistors within the resistor-capacitor circuits of the loop filter 170, where the capacitor Cx and the resistor Rx can be dynamically included into the RC detection circuit 142RC by some switching mechanisms when detection of the aforementioned product of the resistance value and the capacitance value is required. For simplicity, the resistance values of the resistors $\{R81, R82, R83, R84, Rx\}$ and the capacitance value of the capacitor $\{Cx\}$ are respectively written with similar notations $\{R_{81}, R_{82}, R_{83}, R_{84}, R_x\}$ and $\{C_x\}$ hereafter.

The voltage level of the positive terminal of the operational amplifier 810 can be expressed as follows:

$$Va = ((R_{82}+R_{83}+R_{84})/(R_{81}+R_{82}+R_{83}+R_{84}))*AVDD;$$

where the notation AVDD represents the driving voltage of the RC detection circuit 142RC.

In addition, the voltage level of the node between the resistors R82 and R83 can be expressed as follows:

$$Vf = ((R_{83}+R_{84})/(R_{81}+R_{82}+R_{83}+R_{84}))*AVDD.$$

Additionally, the voltage level of the node between the resistors R83 and R84 can be expressed as follows:

$$Vi = (R_{84}/(R_{81}+R_{82}+R_{83}+R_{84}))*AVDD.$$

Given that the current flowing from the resistor Rx into the negative terminal of the operational amplifier 810 is minor and therefore can be ignored, by applying the so-called virtual ground assumption to the operational amplifier 810, the current flowing from the resistor Rx into the transistor 850 can be written as follows:

$$Ix=(AVDD-Va)/R_x$$

$$=(R_{81}/(R_{81}+R_{82}+R_{83}+R_{84}))*AVDD/R_x$$

$$=(R_{81}/R_{tot})*(AVDD/R_x);$$

where $R_{tot}=(R_{81}+R_{82}+R_{83}+R_{84})$.
Therefore, $$Ix/C_x=(R_{81}/R_{tot})*(AVDD/(R_x*C_x));\text{ and}$$

$$\Delta V/\Delta t=(Vf-Vi)/\Delta t$$

$$=(R_{83}/R_{tot})*(AVDD/\Delta t);$$

where the latter of the above two equations represents the voltage level Vx of the upper terminal of the capacitor Cx is charged from the voltage level Vi to the voltage level Vf during a time interval $\Delta t$, and the notation $\Delta V$ represents the voltage difference (Vf−Vi) between the voltage levels Vf and Vi.

Let $\Delta V/\Delta t=Ix/C_x$, it can be written as follows:

$$\Delta V/\Delta t=(R_{81}/R_{tot})*(AVDD/(R_x*C_x)).$$

Solving the above equation, the charging time of the capacitor Cx can be written as follows:

$$T_{charge}=(R_x/R_{81})*R_{83}*C_x;$$

which means the aforementioned product of the resistance value and the capacitance value, such as the product $(R_x*C_x)$, can be rapidly obtained as long as the charging time $T_{charge}$ and the ratio of $(R_{83}/R_{81})$ are known.

It is an advantage that the method and the associated digital compensation filter and the associated calibration circuit can provide precise loop parameter control and improve robustness against PVT variations in contrast to the related art.

It is another advantage that individually measuring the resistance values of the resistors within the PLL 160 (e.g. the resistance values $\{R_2, R_4, R_6\}$ of the resistors $\{R2, R4, R6\}$ shown in FIG. 4B) and the capacitance values of the capacitors within the PLL 160 (e.g. the capacitance values $\{C_2, C_4, C_6\}$ of the capacitors $\{C2, C4, C6\}$ shown in FIG. 4B) are not required. Therefore, when utilizing the method described above, the compensation characteristics of the DCF 130 can rapidly be tuned with ease since the aforementioned product of the resistance value and the capacitance value, such as the product $(R_x*C_x)$, can rapidly be obtained for the use of the on-line self-calibration of the calibration circuit 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for tuning a digital compensation filter within a transmitter, the method comprising:
   obtaining at least one loop gain calibration result by performing loop gain calibration based upon signals of at least a portion of the transmitter, and obtaining at least one resistance-capacitance (RC) detection result by performing RC detection on the portion of the transmitter without individually measuring resistance values of resistors therein and capacitance values of capacitors therein, wherein the RC detection result corresponds to a detected value representing a product of a resistance value and a capacitance value, and the digital compensation filter comprises a gain compensation module and an RC compensation module; and
   tuning the digital compensation filter by respectively inputting the loop gain calibration result and the RC detection result into the gain compensation module and the RC compensation module.

2. The method of claim 1, further comprising:
   tuning the digital compensation filter in order to perform digital compensation on the portion of the transmitter in an on-line self-calibration manner.

3. The method of claim 1, wherein the digital compensation filter is dynamically tuned by respectively inputting a plurality of RC detection results into the RC compensation module such that the digital compensation filter is tuned based upon variations of the RC detection results.

4. The method of claim 1, wherein the portion of the transmitter comprises a phase locked loop (PLL).

5. The method of claim 1, wherein the RC compensation module comprises:
   a plurality of filtering units cascaded in series, wherein each filtering unit of the plurality of filtering units has a transfer function of:

$$H_{C,i}(s)=(1+K_{RC}*(s/w_i));$$

wherein i represents an index associated to one of the filtering units, $K_{RC}$ represents the RC detection result, s=jw with j and w respectively representing an imaginary unit and an angular frequency, and $w_i$ represents a frequency parameter associated to one of the filtering units.

6. The method of claim 5, wherein the digital compensation filter has a transfer function of:

$$H_{Comp}(s)=H_{EQ}(s)+K_{LG}*H_N(s)*H_{C,1}(s)*H_{C,2}(s)*\ldots*H_{C,I}(s);$$

wherein $H_{EQ}(s)$ represents an equal transfer function for a predetermined range of frequency, $K_{LG}$ represents the loop gain calibration result, $H_N(s)$ represents a transfer function of a portion of the digital compensation filter, and I represents a number of filtering units within the plurality of filtering units.

7. A digital compensation filter positioned within a transmitter, comprising:
   a gain compensation module arranged to receive at least one loop gain calibration result, wherein the loop gain calibration result is obtained by performing loop gain calibration based upon signals of at least a portion of the transmitter; and
   a resistance-capacitance (RC) compensation module arranged to receive at least one RC detection result, wherein the RC detection result is obtained by performing RC detection on the portion of the transmitter without individually measuring resistance values of resistors therein and capacitance values of capacitors therein, and the RC detection result corresponds to a detected value representing a product of a resistance value and a capacitance value;
   wherein the digital compensation filter is tuned by respectively inputting the loop gain calibration result and the RC detection result into the gain compensation module and the RC compensation module.

8. The digital compensation filter of claim 7, wherein the digital compensation filter is tuned in order to perform digital compensation on the portion of the transmitter in an on-line self-calibration manner.

9. The digital compensation filter of claim 7, wherein the digital compensation filter is dynamically tuned by respectively inputting a plurality of RC detection results into the RC compensation module such that the digital compensation filter is tuned based upon variations of the RC detection results.

10. The digital compensation filter of claim 7, wherein the portion of the transmitter comprises a phase locked loop (PLL).

11. The digital compensation filter of claim 7, wherein the RC compensation module comprises:
   a plurality of filtering units cascaded in series, wherein each filtering unit of the plurality of filtering units has a transfer function of:

$$H_{C,i}(s)=(1+K_{RC}*(s/w_i));$$

wherein i represents an index associated to one of the filtering units, $K_{RC}$ represents the RC detection result, s=jw with j and w respectively representing an imaginary unit and an angular frequency, and $w_i$ represents a frequency parameter associated to one of the filtering units.

12. The digital compensation filter of claim 11, wherein the digital compensation filter has a transfer function of:

$$H_{Comp}(s)=H_{EQ}(s+K_{LG}*H_N(s)*H_{C,1}(s)*H_{C,2}(s)* \ldots * H_{C,I}(s);$$

wherein $H_{EQ}(s)$ represents an equal transfer function for a predetermined range of frequency, $K_{LG}$ represents the loop gain calibration result, $H_N(s)$ represents a transfer function of a portion of the digital compensation filter, and I represents a number of filtering units within the plurality of filtering units.

13. The digital compensation filter of claim 7, wherein the gain compensation module and the RC compensation module are arranged to be cascaded in series.

14. The digital compensation filter of claim 7, wherein a first path and a second path within the digital compensation filter receive a same input of the digital compensation filter, and the gain compensation module and the RC compensation module are on the first path; and the digital compensation filter further comprises:
   a delay arranged to delay the input of the digital compensation filter in order to generate a delayed version thereof as an output of the second path, wherein the delay is on the second path; and
   an adder arranged to sum up outputs of the first and the second paths to generate an output of the digital compensation filter.

15. A calibration circuit, the calibration circuit being positioned within a transmitter, the calibration circuit comprising:
   a digital compensation filter arranged to perform digital compensation filtering on baseband data to be utilized by at least a portion of the transmitter, the digital compensation filter comprising:
      a gain compensation module; and
      a resistance-capacitance (RC) compensation module; and
   a control module arranged to perform self-calibration control, the control module obtaining at least one loop gain calibration result by performing loop gain calibration based upon signals of the portion of the transmitter, and further obtaining at least one RC detection result by performing RC detection on the portion of the transmitter without individually measuring resistance values of resistors therein and capacitance values of capacitors therein, wherein the RC detection result corresponds to a detected value representing a product of a resistance value and a capacitance value;
   wherein the control module tunes the digital compensation filter by respectively inputting the loop gain calibration result and the RC detection result into the gain compensation module and the RC compensation module.

16. The calibration circuit of claim 15, wherein the control module is arranged to tune the digital compensation filter in order to perform digital compensation on the portion of the transmitter in an on-line self-calibration manner.

17. The calibration circuit of claim 15, wherein the control module is arranged to dynamically tune the digital compensation filter by respectively inputting a plurality of RC detection results into the RC compensation module such that the digital compensation filter is tuned based upon variations of the RC detection results.

18. The calibration circuit of claim 15, wherein the portion of the transmitter comprises a phase locked loop (PLL).

19. The calibration circuit of claim 15, wherein the RC compensation module comprises:
   a plurality of filtering units cascaded in series, wherein each filtering unit of the plurality of filtering units has a transfer function of:

$$H_{C,i}(s)=(1+K_{RC}*(s/w_i));$$

wherein i represents an index associated to one of the filtering units, $K_{RC}$ represents the RC detection result, s=jw with j and w respectively representing an imaginary unit and an angular frequency, and $w_i$ represents a frequency parameter associated to one of the filtering units.

20. The calibration circuit of claim 19, wherein the digital compensation filter has a transfer function of:

$$H_{Comp}(s)=H_{EQ}(s)+K_{LG}*H_N(s)*H_{C,1}(s)*H_{C,2}(s)* \ldots * H_{C,I}(s);$$

wherein $H_{EQ}(s)$ represents an equal transfer function for a predetermined range of frequency, $K_{LG}$ represents the loop gain calibration result, $H_N(s)$ represents a transfer function of a portion of the digital compensation filter, and I represents a number of filtering units within the plurality of filtering units.

* * * * *